United States Patent
Willer et al.

(10) Patent No.: US 6,538,273 B2
(45) Date of Patent: Mar. 25, 2003

(54) FERROELECTRIC TRANSISTOR AND METHOD FOR FABRICATING IT

(75) Inventors: Josef Willer, Riemerling (DE); Georg Braun, München (DE); Till Schlösser, München (DE); Thomas Haneder, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/849,910

(22) Filed: May 4, 2001

(65) Prior Publication Data

US 2001/0042888 A1 Nov. 22, 2001

Related U.S. Application Data

(63) Continuation of application No. PCT/DE99/03514, filed on Nov. 3, 1999.

(30) Foreign Application Priority Data

Nov. 4, 1998 (DE) .......................... 198 50 852

(51) Int. Cl.[7] .............................................. H01L 29/02
(52) U.S. Cl. .................. 257/295; 257/267; 257/280; 257/281; 257/473; 257/618; 257/623; 438/3; 438/161; 438/583; 438/694
(58) Field of Search ............................... 257/295, 267, 257/280, 281, 473, 618, 623; 438/161, 583, 694, 3

(56) References Cited

U.S. PATENT DOCUMENTS 5,940,705 A    8/1999   Lee et al.

6,011,285 A  *  1/2000  Hsu et al. .................. 257/295

FOREIGN PATENT DOCUMENTS

| EP | 0 566 585 B1 | 10/1993 |
| EP | 0869557 A2 | 10/1998 |
| GB | 2299208 A | 9/1996 |
| JP | 10004322 | 8/1998 |

OTHER PUBLICATIONS

Tadahiko Hirai et al.: "Preparation of $SrBi_2Ta_2O_9$ Film at Low Temperatures and Fabrication of a Metal/Ferroelectric/Insulator/Semiconductor Field Effect Transistor Using $Al/SrBi_2Ta_2O_9/CeO_2/Si(100)$ Structures", *Jpn. J. Appl. Phys.*, vol. 36, 1997, Part 1, No. 9B, pp. 5908–5911.

Ho Nyung Lee et al.: "Fabrication of Metal–Ferroelectric–Insulator–Semiconductor Field Effect Transistor (MEFISFET) Using $Pt-SrBi_2Ta_2O_9-Y_2O_3-Si$ Structure", *Extended Abstracts of the 1997 International Conference on Solid State Devices and Materials, Hamamatsu 1997*, pp. 382–383.

* cited by examiner

Primary Examiner—Edward Wojciechowicz
(74) Attorney, Agent, or Firm—Laurence A. Greenberg; Werner H. Stemer; Ralph E. Locher

(57) ABSTRACT

A ferroelectric transistor is disclosed which has two source/drain regions and a channel region disposed in between in a semiconductor substrate. A metallic intermediate layer is disposed on the surface of the channel region and forms a Schottky diode with the semiconductor substrate, and a ferroelectric layer and a gate electrode are disposed on its surface. The ferroelectric transistor is fabricated using steps appertaining to silicon process technology.

10 Claims, 1 Drawing Sheet

FERROELECTRIC TRANSISTOR AND METHOD FOR FABRICATING IT

CROSS-REFERENCE TO RELATED APPLICATION

This application is a continuation of copending International Application No. PCT/DE99/03514, filed Nov. 3, 1999, which designated the United States.

BACKGROUND OF THE INVENTION

1. Field of the Invention

The invention relates to a ferroelectric transistor having two source/drain regions, a channel region and a gate electrode, a layer made of ferroelectric material being provided between the gate electrode and the channel region. A change in the conductivity of the transistor is dependent on the polarization state of the layer made of ferroelectric material. Ferroelectric transistors of this type are being investigated with regard to nonvolatile memories. In this case, two different logic values of a digital information item are assigned two different polarization states of the layer made of ferroelectric material. Further possible uses for ferroelectric transistors of this type are neural networks, for example.

The problem arises with these ferroelectric transistors that ferroelectric material disposed on the surface of a semiconductor substrate exhibits poor interface properties. Furthermore, diffusion processes occur between individual constituents of the ferroelectric material and the semiconductor substrate. In order to reduce the influence of these effects on the electrical properties of a ferroelectric transistor, it has been proposed to use, between the ferroelectric layer and the semiconductor substrate, an intermediate layer made of $SiO_2$, (see European Patent EP 0 566 585 B1) or made of $CeO_2$, $Y_2O_3$ or $ZrO_2$ (see, for example, the reference by T. Hirai et al., Jpn, J. Appl. Phys. Vol. 36 (1997) pages 5908 to 5911 or H. Nyung Lee et al, Ext. Abst. Int. Conf. SSDM, Hamamatsu, 1997, pages 382 to 383). These materials are insulating stable oxides which ensure a sufficiently good interface between the ferroelectric layer and the surface of the semiconductor substrate.

In the ferroelectric transistor, the intermediate layer acts as an additional capacitance which, when a voltage is applied between the gate electrode and the semiconductor substrate, reduces that part of the voltage which is dropped across the ferroelectric layer. This impairs the punch-through of a voltage present at the gate electrode to the channel region. When storing information in the ferroelectric transistor by applying a sufficiently high voltage to the ferroelectric layer, so that the polarization of the ferroelectric material is changed, only part of the applied voltage is thus dropped across the ferroelectric layer.

SUMMARY OF THE INVENTION

It is accordingly an object of the invention to provide a ferroelectric transistor and a method for fabricating it which overcome the above-mentioned disadvantages of the prior art devices and methods of this general type, in which the punch-through of a voltage present at the gate electrode is improved compared with known solutions, without impairing the interfaces.

With the foregoing and other objects in view there is provided, in accordance with the invention, a ferroelectric transistor. The ferroelectric transistor contains a semiconductor substrate having a surface, two source/drain regions disposed in the semiconductor substrate and each having a surface, a channel region disposed between the two source/drain regions in the semiconductor substrate and having a surface, and a metallic intermediate layer disposed on the surface of the channel region and forms a Schottky diode with the semiconductor substrate. The metallic intermediate layer also has a surface. A ferroelectric layer is disposed on the surface of the metallic intermediate layer and the ferroelectric layer has a surface. A gate electrode is disposed on the surface of the ferroelectric layer.

The ferroelectric transistor has the two source/drain regions and the channel region disposed in between in the semiconductor substrate. The metallic intermediate layer is disposed on the surface of the channel region and forms a Schottky diode with the semiconductor substrate. The ferroelectric layer is disposed on the surface of the metallic intermediate layer, the gate electrode being disposed on the surface of the ferroelectric layer. The ferroelectric transistor thus has the structure of a MESFET whose gate electrode is isolated from the actual metal semiconductor contact by the ferroelectric insulator.

The memory cell can be operated for example as now described. In order to read out the information, a short voltage pulse (for example a few ns) is applied to the gate electrode of the transistor with a direction such that the Schottky contact is operated in the reverse direction. The magnitude and duration of the voltage pulse is chosen such that the pulse suffices to reverse the polarization of the ferroelectric layer (duration of the order of magnitude of ns) but, does not suffice to allow the charge $\Delta Q$ corresponding to the polarization-reversal operation or the charge Q corresponding to the dielectric proportion to flow through the Schottky contact operated in the reverse direction.

The effect that can thereby be achieved is that, during the pulse duration, part of the voltage present at the gate electrode is dropped across the Schottky contact.

When a voltage pulse is applied, two cases are to be decided.

In the first case, if the polarization direction of the ferroelectric layer at the beginning of the voltage pulse is such that it is rotated by the voltage pulse, then the voltage between the gate electrode and the semiconductor will initially drop, namely for the duration of the polarization-reversal operation, and only then be constant.

In the second case, if, by contrast, at the beginning of the voltage pulse at the gate electrode, the ferroelectric layer is already polarized in the direction of the voltage, then the ferroelectric layer behaves similarly to a purely dielectric layer, that is to say the voltage dropped between the gate electrode and the semiconductor during the pulse duration $\Delta t$ is constant.

If the doping in the channel region of the transistor is chosen accordingly, then it is possible, using that part of the voltage at the gate electrode which is dropped across the Schottky contact, to control the transistor, that is to say to switch the transistor on or off, depending on whether a normally off or a normally on transistor is involved.

Thus, with a normally off transistor, the quantity of charge which flows through the channel of the transistor during the pulse duration will be smaller in the first case than in the second case. The opposite is true for a normally on transistor. By integrating the quantity of charge during the pulse duration, it is possible to evaluate the stored information.

If the written information was destroyed by the read-out operation (first case), then it must subsequently be written back to the cell.

The writing or erasing of information to or in a cell can be effected by a larger voltage between the gate electrode and the semiconductor than for the read-out of information, which brings about larger currents through the Schottky contact (both in the forward direction and in the reverse direction) of the configuration, with the result that the voltage dropped across it becomes zero after a short time and the entire voltage between the electrode and the semiconductor or the metal layer (the semiconductor and metal layer are at the same potential) is dropped across the ferroelectric layer.

As an alternative, the writing or erasing of information can also be effected on a different, longer time scale than for the read-out, with the result that, during longer pulse durations, more charge can flow through the Schottky contact and, therefore, voltage is no longer dropped across the Schottky contact after a short time (for example tens of ns) in this case as well.

Further methods of operating the memory cell are possible.

Consequently, in the ferroelectric transistor, the additional capacitance between semiconductor substrate and ferroelectric layer that is present in the known ferroelectric transistors is obviated both when storing information and when erasing information. At the same time, direct contact between the ferroelectric layer and the semiconductor surface is avoided.

It lies within the scope of the invention to provide the metallic intermediate layer to be made of Pt, $WSi_2$, Au or Ti. The use of $WSi_2$ has the advantage that $WSi_2$ can be produced with good interface properties on the surface of a semiconductor substrate.

Preferably, the surface of the channel region terminates with the surface of the semiconductor substrate, while the surface of the source/drain regions is disposed below the surface of the semiconductor substrate. This avoids a short circuit between the source/drain regions via the metallic intermediate layer.

As an alternative, such a short circuit can also be prevented by the source/drain regions having a lateral doping profile, so that they form a Schottky contact in the region of overlap with the metallic intermediate layer. In this refinement, it is not necessary to lower the surface of the source/drain regions in order to avoid the short circuit.

The use of platinum for the metallic intermediate layer has the advantage that many ferroelectric materials are very well suited to the deposition on platinum. Such deposition methods are being investigated and optimized in connection with the development of ferroelectric capacitors.

The intermediate layer is preferably composed of two partial layers, a first partial layer adjacent to the surface of the channel region being formed from $WSi_2$ and a second partial layer adjoining the ferroelectric layer being made from platinum. As a result, a good interface with the semiconductor substrate and good deposition conditions for the ferroelectric layer are obtained at the same time.

All ferroelectric materials are suitable for the ferroelectric layer. In particular, the ferroelectric layer has strontium bismuth tantalate (SBT), lead zirconium titanate (PZT), lithium niobate ($LiNbO_3$) or barium strontium titanate (BST)

With regard to the dielectric strength of the ferroelectric transistor, it is advantageous to provide the metallic intermediate layer, the ferroelectric layer and the gate electrode with common sidewalls provided with insulating spacers. In this case, it is advantageous to form the insulating spacers from ferroelectric material, since this avoids impairment of the properties of the ferroelectric layer by an interface with another material.

Such a ferroelectric transistor is preferably fabricated within silicon process technology. In particular, a monocrystalline silicon wafer, a silicon-on-insulator (SOI) substrate or an SIC substrate is suitable as the semiconductor substrate.

The gate electrode is formed from platinum or doped polysilicon, and the semiconductor substrate contains silicon.

Furthermore, a III-V semiconductor substrate, for example a GaAs substrate, in particular made of semi-insulating GaAs, is suitable as the semiconductor substrate. Since MESFETs are often realized in semi-insulating GaAs substrates, the memory cell can readily be integrated into this technology.

In order to fabricate the ferroelectric transistor, the metallic intermediate layer, which forms the Schottky diode with the semiconductor substrate, the ferroelectric layer and the gate electrode are formed by deposition and patterning. Source/drain regions are formed in the semiconductor substrate on two mutually opposite sides of the gate electrode. The metallic intermediate layer can be patterned both by lift-off technology and by etching technology. The ferroelectric layer can be formed by a single-stage or multistage sol gel method or by deposition in a chemical vapor deposition (CVD) process and subsequent heat treatment.

In accordance with a concomitant feature of the invention, the source/drain regions are formed with a lightly doped drain profile.

Other features which are considered as characteristic for the invention are set forth in the appended claims.

Although the invention is illustrated and described herein as embodied in a ferroelectric transistor and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
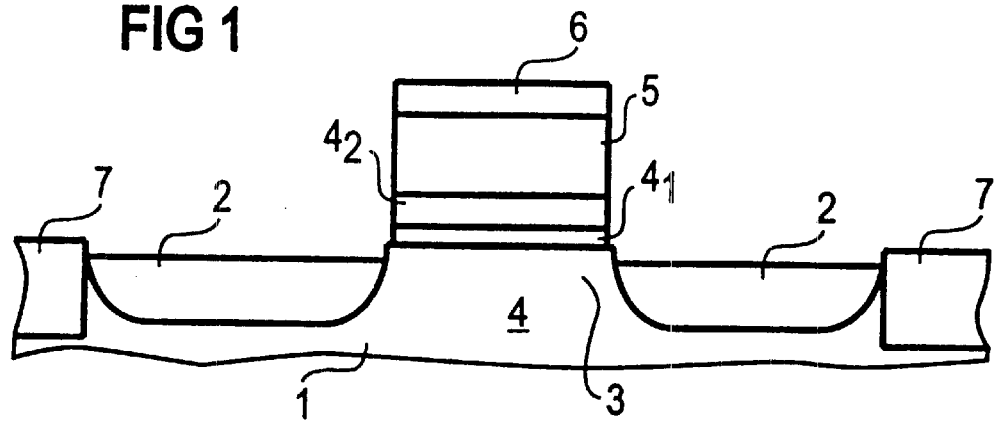
FIG. 1 is a diagrammatic, partial sectional view through a ferroelectric transistor having a metallic intermediate layer between a channel region and a ferroelectric layer.

In all the figures of the drawing, sub-features and integral parts that correspond to one another bear the same reference symbol in each case. Referring now to the figures of the drawing in detail and first, particularly, to FIG. 1 thereof, there is shown two source/drain regions 2 that are disposed in a p-doped semiconductor substrate 1 made of monocrystalline silicon. A channel region 3 is disposed between the 1, source/drain regions 2. The source/drain regions 2 are n-doped and have a dopant concentration of approximately $10^{19}$ cm$^{-3}$ to $10^{20}$ cm$^{-3}$.

A metallic intermediate layer 4 is disposed on a surface of the channel region 3, the intermediate layer containing a WSi$_2$ layer $4_1$ having a thickness of 30 to 50 nm and a platinum layer $4_2$ having a thickness of 100 nm. In this case, the WSi$_2$ layer $4_1$ adjoins the surface of the semiconductor substrate 1. The platinum layer $4_2$ is disposed above the WSi$_2$ layer $4_1$.

A ferroelectric layer 5 made of strontium bismuth tantalate (SET) or lead zirconium titanate (PZT) is disposed on the surface of the platinum layer $4_2$. The ferroelectric layer 5 has a thickness of 100 nm.

A gate electrode 6 is disposed on the surface of the ferroelectric layer 5. The gate electrode 6 contains platinum and has a thickness of 100 nm.

The gate electrode 6, the ferroelectric layer 5 and the metallic intermediate layer 4 have common sidewalls that reach to the surface of the semiconductor substrate 1. The channel region 3 terminates with the surface of the semiconductor substrate 1, while the surface of the source/drain regions 2 is disposed below the surface of the semiconductor substrate 1. This prevents the source/drain regions 2 from being short-circuited via the metallic intermediate layer 4.

The source/drain regions 2 are insulated from adjacent components by an insulation structure 7 in the semiconductor substrate 1. The insulation structure 7 annularly surrounds an active region for the ferroelectric transistor. The insulation structures 7 are realized by shallow trenches filled with SiO$_2$.

Figure 2:
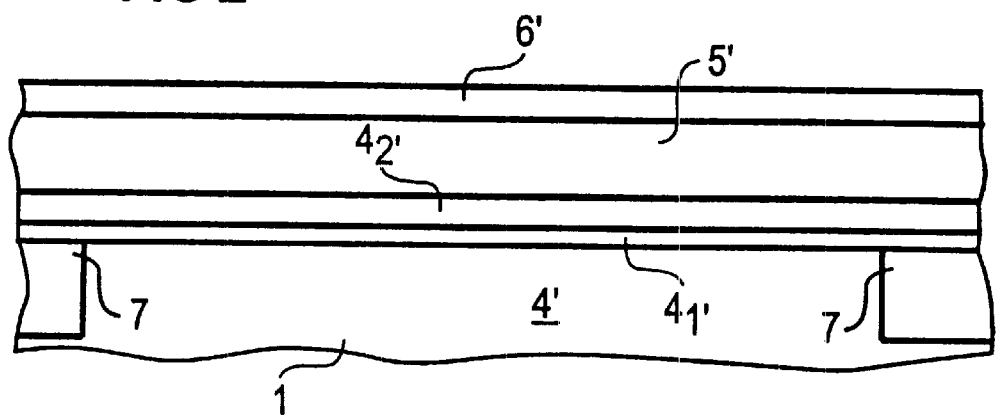
FIG. 2 is a diagrammatic, partial sectional view of a semiconductor substrate after the formation of the metallic intermediate layer and the ferroelectric layer.

In order to fabricate the ferroelectric transistor explained with reference to FIG. 1, first the insulation structures 7 are formed in the semiconductor substrate 1. To that end, an insulating trench is etched, which completely surrounds the active region in the ferroelectric transistor, and is filled with an insulating material (see FIG. 2). As an alternative, the insulation structures 7 can be formed by local oxidation in a local oxidation of silicon (LOCOS) method.

Figure 3:
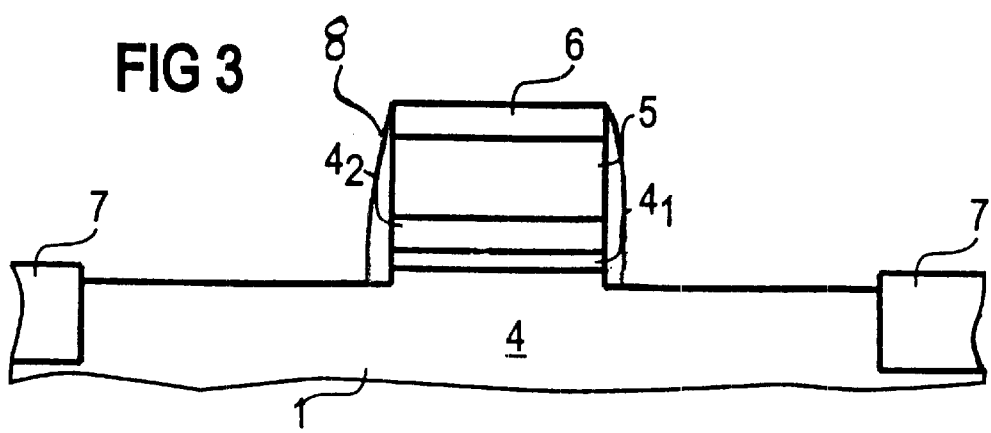
FIG. 3 is a diagrammatic, partial sectional view of the semiconductor substrate after the formation of a gate electrode.

Afterward, a whole-area WSi$_2$ layer $4_1'$, a whole-area platinum layer $4_2'$, a whole-area ferroelectric layer $5'$ and a further whole-area platinum layer $6'$ are applied to the surface of the semiconductor substrate 1 in order to form the WSi$_2$ layer $4_1$, the platinum layer $4_2$, the ferroelectric layer 5 and the gate electrode 6. The whole-area WSi$_2$ layer $4_1'$ is formed by chemical vapor deposition (CVD), and the whole-area platinum layer $4_2'$ and the further whole-area platinum layer $6'$ are formed by sputtering or CVD. The whole-area ferroelectric layer $6'$ is formed in a single-stage or multistage sol gel method or by CVD deposition and subsequent heat treatment at 500° C. to 800° C. During the subsequent heat treatment, the desired ferroelectric phase is produced in the ferroelectric layer. The layers $4_1'$, $4_2'$, $5'$, $6'$ are subsequently patterned (see FIG. 3) using a non-illustrated common mask. In this case, the gate electrode 6 is formed from the further whole-area platinum layer $6'$ by etching using Cl, Ar or a mixture thereof. The platinum layer $4_2$ and the WSi$_2$ layer $4_1$ are fabricated by etching using Cl, Ar or CF$_4$. In this case, the gate electrode 6 is protected with resist. The etching is overrun to an extent such that the surface of the semiconductor substrate 1 is etched back by 5 to 20 nm laterally with respect to the gate electrode 6.

The source/drain regions 2 are formed in a self-aligned manner with respect to the insulation structure 7 by implantation with As. The structure illustrated in FIG. 1 is produced.

As an alternative, the gate electrode 6 can be formed from doped polysilicon. In this case, it is expedient to provide a barrier layer made, for example, of TiN between the gate electrode 6 and the ferroelectric layer 5.

If technologically necessary, the sidewalls of the gate electrode 6, of the ferroelectric layer 5 and of the metallic intermediate layer 4 can be provided with insulating spacers 8 made, in particular, of the same ferroelectric material as the ferroelectric layer 5.

The insulating spacers 8 are preferably formed from the same material as the ferroelectric layer 5 since this avoids impairment of the properties of the ferroelectric layer 5 which can be caused when using insulating spacers made of a different material.

Furthermore, there may be disposed between the source/drain regions 2 and the channel region 3 in each case a lightly doped drain (LDD) region which has a lower dopant concentration than the source/drain regions 2 and a smaller vertical extent than the source/drain regions 2. The LDD regions are formed with a dopant concentration of $10^{18}$ cm$^{-3}$, for example.

We claim:

1. A ferroelectric transistor, comprising:

a semiconductor substrate having a surface;

two source/drain regions disposed in said semiconductor substrate and each having a surface;

a channel region disposed between said two source/drain regions in said semiconductor substrate and having a surface;

a metallic intermediate layer disposed on said surface of said channel region and forming a Schottky diode with said semiconductor substrate, said metallic intermediate layer having a surface;

a ferroelectric layer disposed on said surface of said metallic intermediate layer and said ferroelectric layer having a surface;

a gate electrode disposed on said surface of said ferroelectric layer; and said surface of said channel region terminating with said surface of said semiconductor substrate, and said surface of each of maid source/drain regions being disposed below said surface of said semiconductor substrate.

2. The ferroelectric transistor according to claim 1, wherein said metallic intermediate layer contains at least one material selected from the group consisting of Pt, WSi$_2$, Au and Ti.

3. The ferroelectric transistor according to claim 2, wherein said metallic intermediate layer is formed of platinum at least in a region of an interface with said ferroelectric layer.

4. The ferroelectric transistor according to claim 1, wherein said metallic intermediate layer, said ferroelectric layer and said gate electrode have common sidewalls and including insulating spacers disposed on said common sidewalls.

5. The ferroelectric transistor according to claim 4, wherein said insulating spacers are formed from a ferroelectric material.

6. The ferroelectric transistor according to claim 1, wherein said ferroelectric layer contains a material selected from the group consisting of strontium bismuth tantalate (SBT), lead zirconium titanate (PZT), lithium niobate (LiNbO$_3$) and barium strontium titanate (BST).

7. The ferroelectric transistor according to claim 1, wherein said gate electrode contains a material selected from the group consisting of platinum and doped polysilicon, and said semiconductor substrate contains silicon.

8. A method for fabricating a ferroelectric transistor, which comprises the steps of:

provYLing a semiconductor substrate having a surface;

forming a channel region in the semiconductor substrate, the channel region having a surface;

depositing a metallic intermediate layer on the surface of the channel region and the metallic intermediate layer forming a Schottky diode with the semiconductor substrate;

depositing a ferroelectric layer on the metallic intermediate layer;

depositing a gate electrode layer on the ferroelectric layer;

patterning the ferroelectric layer, the metallic intermediate layer and the gate electrode layer;

forming source/drain regions in the semiconductor substrate on two mutually opposite sides of the gate electrode, the source/drain regions having a surface; and terminating the surface of the channel region with the surface of the semiconductor substrate, and placing the surface of each of the source/drain regions below the surface of the semiconductor substrate.

9. The method according to claim 8, which comprises:

forming the metallic intermediate layer, the ferroelectric layer and the gate electrode layer with common sidewalls; and forming insulating spacers on the common sidewalls.

10. The method according to claim 9, which comprises forming the source/drain regions with a lightly doped drain profile.

* * * * *